(12) United States Patent
Lee et al.

(10) Patent No.: US 7,317,247 B2
(45) Date of Patent: Jan. 8, 2008

(54) SEMICONDUCTOR PACKAGE HAVING HEAT SPREADER AND PACKAGE STACK USING THE SAME

(75) Inventors: Jong-Joo Lee, Gyeonggi-do (KR); Young-Hee Song, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 336 days.

(21) Appl. No.: 11/065,822

(22) Filed: Feb. 24, 2005

(65) Prior Publication Data

US 2005/0199993 A1    Sep. 15, 2005

(30) Foreign Application Priority Data

Mar. 10, 2004    (KR)    ............. 10-2004-0016179

(51) Int. Cl.
*H01L 23/02* (2006.01)
*H01L 23/34* (2006.01)

(52) U.S. Cl. ............ 257/706; 257/707; 257/713; 257/719; 257/686; 257/E33.075; 257/E23.051; 257/E23.085

(58) Field of Classification Search ............ 257/276, 257/625, 675, 685, 686, 706, 707, 777, 712–722, 257/E25.013, E25.018, E25.021, E25.027, 257/E23.085, E21.614, E33.075, 733–776, 257/780–786

See application file for complete search history.

(56) References Cited

U.S. PATENT DOCUMENTS 5,900,670 A * 5/1999 Schneider et al. .......... 257/718
6,191,360 B1 * 2/2001 Tao et al. .................. 174/522
6,410,988 B1    6/2002 Celetka et al.
6,486,554 B2   11/2002 Johnson
6,559,536 B1 * 5/2003 Katoh et al. ............... 257/712
2004/0084763 A1 * 5/2004 Yang ......................... 257/706

FOREIGN PATENT DOCUMENTS

JP    2000-114413    4/2000

(Continued)

OTHER PUBLICATIONS

English language abstract of Korean Publication No. 2002-76837.

(Continued)

*Primary Examiner*—Jasmine Clark
(74) *Attorney, Agent, or Firm*—Marger Johnson & McCollom, P.C.

(57) ABSTRACT

A semiconductor package which can be stacked to form a package stack that includes a semiconductor chip with bonding pads, a board having contact pads on its upper surface and bump pads on its lower surface, a heat spreader attached to the rear side of the semiconductor chip and covering the upper surface of the board, and external contact terminals including ground terminals and signal terminals formed on the bump pads. The contact pads of the board include ground contact pads connected with the ground terminals and signal contact pads connected with the signal terminals. The heat spreader includes indented parts to expose the signal contact pads and protruded parts to cover the ground contact pads which are exposed through holes formed on the protruded parts on the peripheral part of the heat spreader. The semiconductor package can alternatively have the heat spreader attached to the lower surface of the board.

62 Claims, 16 Drawing Sheets

FOREIGN PATENT DOCUMENTS

| | | | |
|---|---|---|---|
| JP | 2004-031650 | | 1/2004 |
| KR | 2000-0028359 | | 5/2000 |
| KR | 2002-0055687 | | 7/2002 |
| KR | 2002-76837 | | 10/2002 |
| KR | 2003-0041653 | | 5/2003 |
| KR | 2003-742187 | * | 6/2003 |
| KR | 2003-0060436 | | 7/2003 |

OTHER PUBLICATIONS

English language abstract of Korean Publication No. 2002-0055687.

English language abstract of Korean Publication No. 2003-0041653.

English language abstract of Korean Publication No. 2000-0028359.

English language abstract of Japanese Publication No. 2000-114413.

English language abstract of Korean Publication No. 2003-0060436.

English language abstract of Japanese Publication No. 2004-031650.

\* cited by examiner

SEMICONDUCTOR PACKAGE HAVING HEAT SPREADER AND PACKAGE STACK USING THE SAME

CROSS REFERENCE TO RELATED APPLICATIONS

This U.S. non-provisional application claims priority under 35 U.S.C. §119 to Korean Patent Application No. 2004-16179 filed Mar. 10, 2004, the contents of which are incorporated herein in its entirety by reference.

BACKGROUND OF THE INVENTION

1. Field of the Invention

The present invention relates generally to a semiconductor package and a package stack using the same and, more particularly, to a semiconductor package having a heat spreader and a package stack using the same.

2. Description of the Related Art

The electronics industry continues to seek products that are lighter, faster, smaller, multi-functional, more reliable and more cost-effective. One of the important technologies making these objectives possible is semiconductor packaging technology by which a chip scale package (CSP) was recently realized. CSP technology provides a small sized package having the size level of a semiconductor chip.

A semiconductor package having a large capacity as well as small size is also required. However, to improve the capacity of a semiconductor package a technique to put a large number of cells into a semiconductor chip of restricted space is required which needs a higher level of technologies, such as minute line pitch and enough developing time. Therefore, currently, research is directed toward realizing a high degree of integration within semiconductor chips or semiconductor packages already developed. For example, package stacks are produced by stacking a plurality of semiconductor chips or semiconductor packages in three dimensions.

Package stacks may be manufactured by stacking packages that have already passed the necessary tests for their functions. Therefore, the yields and reliability of these package stacks may be higher than those stacked chip packages manufactured by stacking a plurality of chips without being tested. However, the package stacks may be thicker as compared with stacked chip packages because of the thickness of each individual package stack.

A semiconductor package suitable for high speed and performance generates a large quantity of heat during the operation, which results in degeneration of performance. Therefore, for the purpose of improving heat dissipation capability, a heat spreader attached to the semiconductor package has been used as in U.S. Pat. No. 6,410,988, No. 6,486,554 and Korean Patent Publication No. 2000-28359.

However, since the heat spreaders in the prior art have a structure where a thermal conductive pad is simply attached on the rear side of a molding body or a semiconductor chip, the prior art merely improved heat dissipation while not improving electrical performance. This kind of structure in the prior art can even cause electromagnetic interference (EMI) problems.

To prevent the degeneration of electric performance and to further improve electrical performance, Japanese Patent Publication No. 2000-114413, Korean Patent Publication No. 2002-76837 and No. 2003-41653 suggested a technique of contacting a heat spreader with a ground terminal of the semiconductor package.

However, the semiconductor package having grounded a heat spreader is not suitable for a package stack within the structure disclosed in the prior art. Those structures need additional means for electric connection between a lower package and an upper package because the upper package is placed on the heat spreader of the lower package, which results in increasing the thickness or width of the package stack.

SUMMARY OF THE INVENTION

A semiconductor package with a heat shield is provided that does not require additional means to electrically connect upper and lower packages and provides improved protection from electromagnetic interference.

One embodiment provides a chip mounted on a board with a heat spreader mounted on a rear side of the chip. External contact terminals protrude a height greater than the combined height of the chip and heat spreader from the lower surface of the board. Ground bumps can connect the board to the heat spreader for improved protection from EMI.

Another embodiment provides the same package stacked onto another similar package with the external contact terminals of the upper package connecting to the upper surface of the board of the lower package. A predetermined number of external contact terminals of the upper package protrude through and connect with ground holes in the heat spreader overlying contact pads on the upper surface of board in the lower package. The remaining external contact terminals in the upper package are vertically exposed by the heat spreader to contact pads on the board of the lower package and connect to those contact pads.

Yet another embodiment provides a chip mounted on an upper surface of a board with a heat spreader mounted on a lower surface of the board. External contact terminals protrude a height greater than the combined height of the chip and heat spreader from the lower surface of the board. A predetermined number of external contact terminals protrude through and connect with ground holes in the heat spreader. The remaining external contact terminals are vertically exposed by the heat spreader. A top heat spreader can be attached to the rear side of the chip and ground bumps can connect contact pads on the upper surface of the board to the top heat spreader for improved protection from EMI.

Yet another embodiment stacks the packages with heat spreaders mounted on the lower surfaces of the board. The external contact terminals of an upper package are connected with contact pads located on the upper surface of the board in the lower package. A top heat spreader can be attached to the rear side of the chip in the upper package and ground bumps can connect contact pads on the upper surface of the board in the upper package to the top heat spreader for improved protection from EMI.

DETAILED DESCRIPTION

Figure 1:
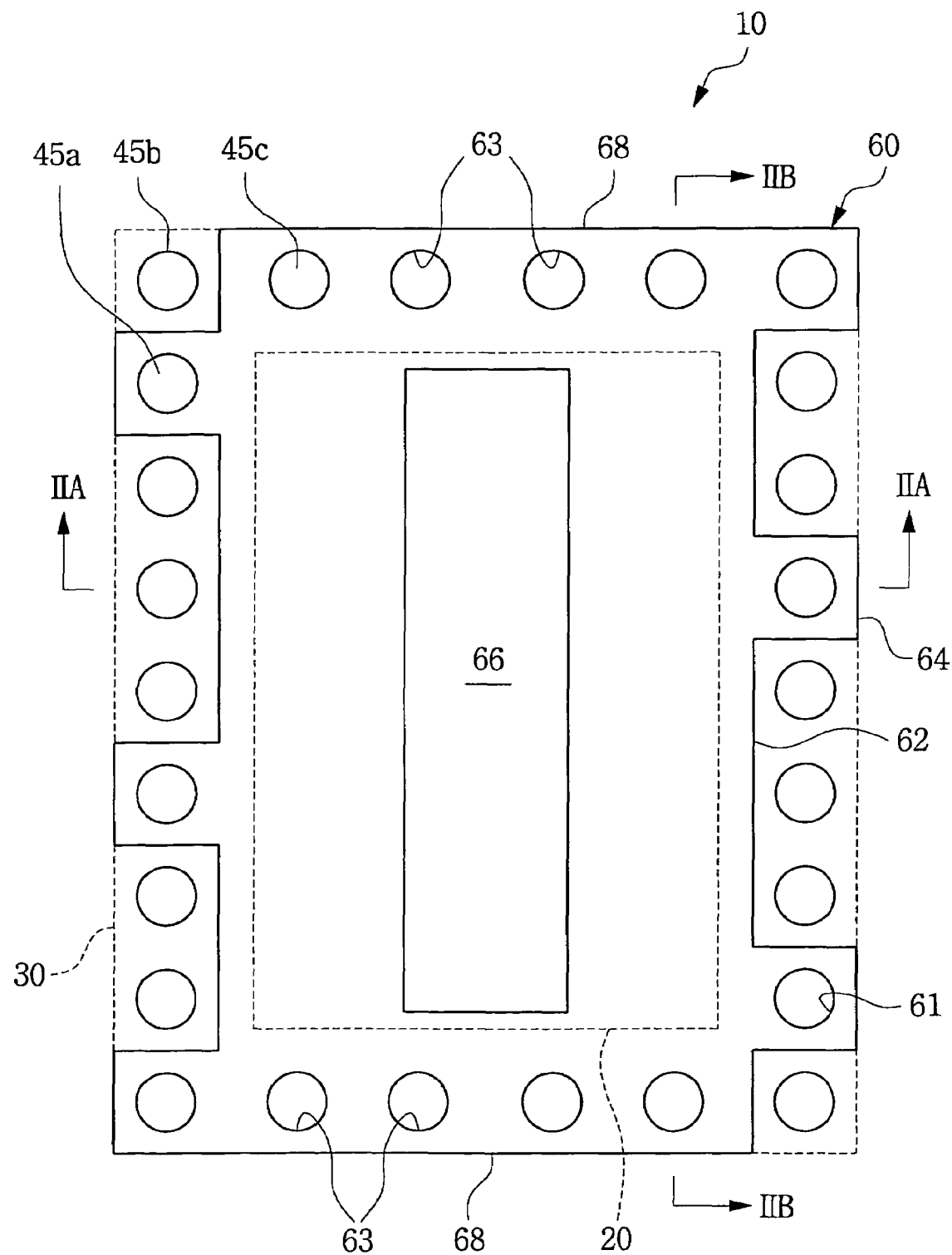
FIG. 1 is a plan view of a semiconductor package having a heat spreader according to a first exemplary embodiment of the present invention.

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In the description, well-known structures and processes have not been described or illustrated in detail to avoid obscuring the present invention. It will be appreciated that the figures are not drawn to scale. Rather, for simplicity and clarity of illustration, the dimensions of some of the elements are exaggerated relative to other elements. Like reference numerals and characters are used for like and corresponding parts of the various drawings.

FIRST EXEMPLARY EMBODIMENT

Figure 2A:
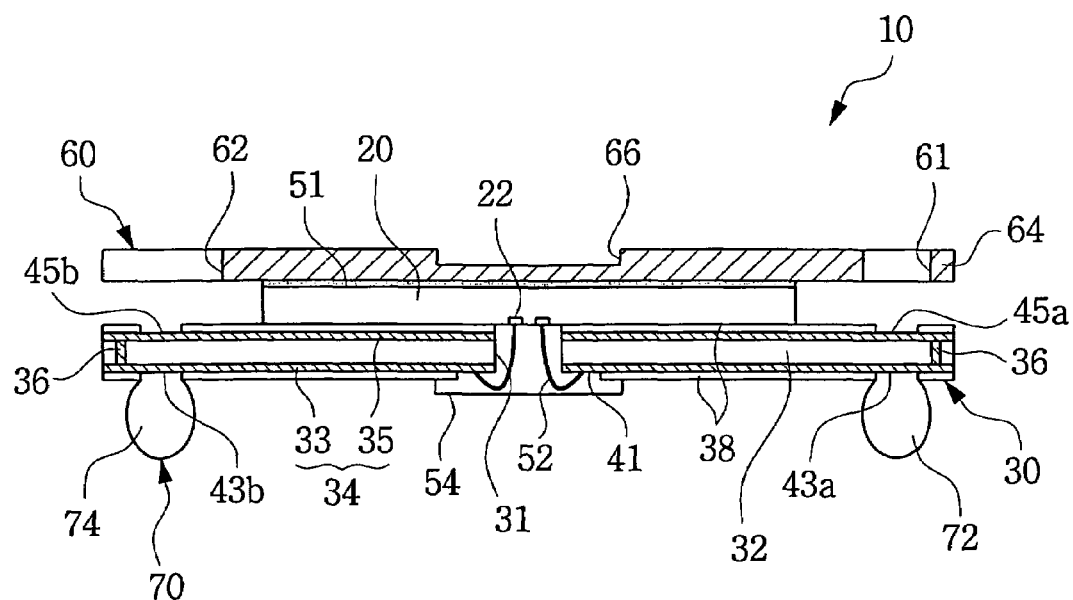
FIG. 2A is a cross-sectional view taken along the line IIA-IIA in FIG. 1.
Figure 2B:
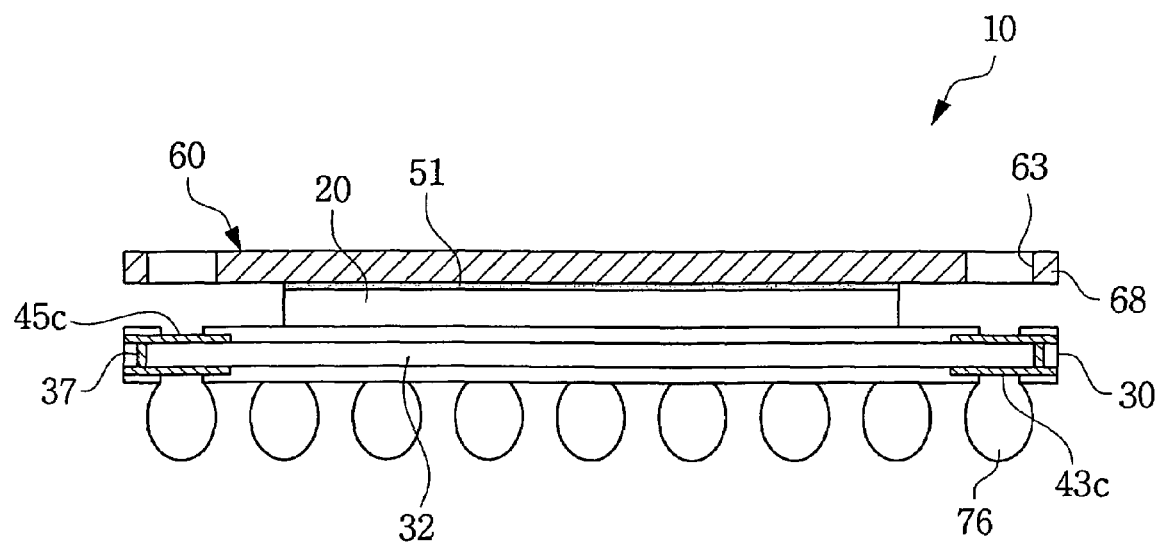
FIG. 2B is a cross-sectional view taken along the line IIB-IIB in FIG. 1.

FIG. 1 is a plan view of a semiconductor package having heat spreader according to a first exemplary embodiment of the present invention. FIG. 2A is a cross-sectional view taken along the line IIA-IIA in FIG. 1. FIG. 2B is a cross-sectional view taken along the line IIB-IIB in FIG. 1.

Referring to FIGS. 1 through 2B, in the semiconductor package 10, according to the first exemplary embodiment of the present invention, the semiconductor chip 20 is mounted on and connected with the board 30 with its active surface facing the upper surface of the board 30. The heat spreader 60 is attached to the rear side of the semiconductor chip 20. And the external terminals 70 are formed on the peripheral part of the lower surface of the board 30.

More specifically, the semiconductor chip 20 is a center pad type, of which bonding pads 22 are formed on the center region of the active surface. Generally, a center pad type semiconductor chip is more favorable for high-speed operation than an edge type semiconductor.

The board 30 has metal wiring layers 34 formed on both sides and has a window 31 on its center portion in order to expose the bonding pads 22 of the semiconductor chip 20. The board 30 could be a wired tape, a printed circuit board or a ceramic board. More specifically, the board 30 has the window 31 on its center portion and includes the board body 32 having a larger area than the active surface of the semiconductor chip 20 and metal wiring layers 34 formed on both sides of the board body 32. The metal wiring layers 34 include lower wiring layer 33 formed on the lower surface of the board body 32 and upper wiring layer 35 formed on the upper surface of the board body 32. The lower wiring layer and upper wiring layer are electrically connected through via holes 36 and 37, which pass through the board body 32. The lower wiring layer 33 includes the board pads 41 which are arranged near the window 31 and electrically connected with the bonding pads 22 of the semiconductor chip 20 and the bump pads 43a, 43b and 43c formed on the peripheral part of the lower surface of the board body 32. The upper wiring layer 35 includes the contact pads 45a, 45b and 45c which are formed on the upper surface of the board body 32 opposed to the bump pads 43a, 43b and 43c, and electrically connected with the bump pads 43a, 43b and 43c through via holes 36. The metal wiring layers 34 are protected by the insulating layer 38 formed on the entire surface of the board body 32 except at the board pads 41, bump pads 43a, 43b and 43c, and contact pads 45a, 45b and 45c. Photo solder resist is generally used for the insulating layer 38. According to the first exemplary embodiment of the present invention, the board 30 further includes at least one metal wiring layer inside the board body 32.

The heat spreader 60 attached to the rear side of the semiconductor chip 20 mounted on the board 30 radiates the heat generated when the chip 20 operates. The heat spreader 60 covering the rear side of the semiconductor chip 20 has the same width and length dimensions of the board 30, and preferably consists of a metal plate whose thermal and electrical conductivity is rather high such as copper (Cu) or aluminum (Al). The heat spreader 60 is attached to the rear side of the semiconductor chip 20 by the adhesive 51. The adhesive could possibly be non-conductive but it is preferable to use conductive adhesive to improve electrical ground connectivity and heat radiation. The conductive adhesive could be a solder, a conductive epoxy adhesive or a conductive tape.

The bonding pads 22 exposed by the window 31 are electrically connected to the board pads 41 through the window 31 by bonding wires 52. The bonding pads 22, the board pads 41 and the bonding wires 52 are protected from the outer environment by an encapsulant 54 formed by filling the window 31 with a molding resin. The external contact terminals 70 are formed on the bump pads 43a, 43b and 43c. Generally solder balls are used for the external contact terminals 70, but metal bumps such as nickel (Ni) and gold (Au) can also be used. The external contact terminals 70 are divided into terminals for ground connection 72 ('ground terminals' hereafter) and terminals for signal and power 74 ('signal terminals' hereafter). Hereafter, a ground pad means the bump pad 43a on which the ground terminal 72 is formed, and a signal pad means the bump pad 43b on which the signal terminal 74 is formed. Also, a ground contact pad means the contact pad 45a corresponding to the ground pad 43a, and a signal contact pad means the contact pad 45b corresponding to the signal pad 43b.

Indented and protruded parts 62 and 64 are formed on the periphery of the heat spreader 60. The indented parts 62 are formed to expose the signal contact pads 45b through the heat spreader 60 covering the board 30, and the protruded parts 64 are formed to oppose the ground contact pads 45a. Ground holes 61 are formed on the protruded parts 64 in order to expose ground contact pads 45a. When packages are stacked, the external contact terminals 70 of the upper package are to be connected with the contact pads 45a, 45b and 45c under the heat spreader 60 of the lower package. A cavity 66 of predetermined depth is formed on the center portion of the upper surface of the heat spreader 60 in order to insert the encapsulant 54 protruded from the lower surface on the board 30.

The external contact terminals 70, according to the first exemplary embodiment of the present invention, include the ground terminal 72 and signal terminal 74 each formed on opposing sides of the board 30, and further the dummy ground terminals 76 formed on the other opposing sides of the board 30 in order to make a metal shielding box when stacking packages. The ground pads 43a are formed on the lower surface of board 30 in opposition with ground contact pads 45a formed on the upper surface of board 30. The signal pads 43b are formed on the lower surface of board 30 in opposition with signal contact pads 45b formed on the upper surface of board 30. The dummy ground pads 43c are formed on the lower surface of board 30 in opposition with dummy ground contact pads 45c formed on the upper surface of board 30. The dummy ground contact pads 45c are formed on the opposing parts of the upper surface of the board 30 to the parts of the lower surface on which the dummy ground pads 43c are formed. The dummy ground pads 43c and the dummy ground contact pads 45c are connected through via hole 37 ('dummy via hole' hereafter). Dummy protruded parts 68 covering the dummy ground contact pads 45c and having dummy ground holes 63 to expose the dummy ground contact pads 45c are formed at the periphery of the heat spreader 60.

Further, it is desirable to form the dummy ground terminals 76 on the peripheral part of the lower surface of the board 30 at regular intervals in order to obtain the desired results of a metal shielding box.

According to the first exemplary embodiment of the invention, it is preferable that the height of the external contact terminals 70 protruding from the lower surface of the board 30 is greater than the sum of the height of the semiconductor chip 20 and that of the heat spreader 60 mounted on the upper surface of the board 30 for the purpose of attaching the external contact terminals 70 of an upper stacked semiconductor package to the contact pads 45a, 45b and 45c of a lower stacked semiconductor package. Moreover, it is preferable to form the inner diameters of the ground holes 61 and of the dummy ground holes 63 to correspond to the maximum horizontal diameter of the ground terminals 72 and of the dummy ground terminals 76, which are inserted in the ground holes 61 and the dummy ground holes 63, respectively, of the lower stacked semiconductor package for the purpose of attaching the ground terminals 72 and dummy ground terminals 76 to the heat spreader 60 of the lower stacked semiconductor package.

Figure 3:
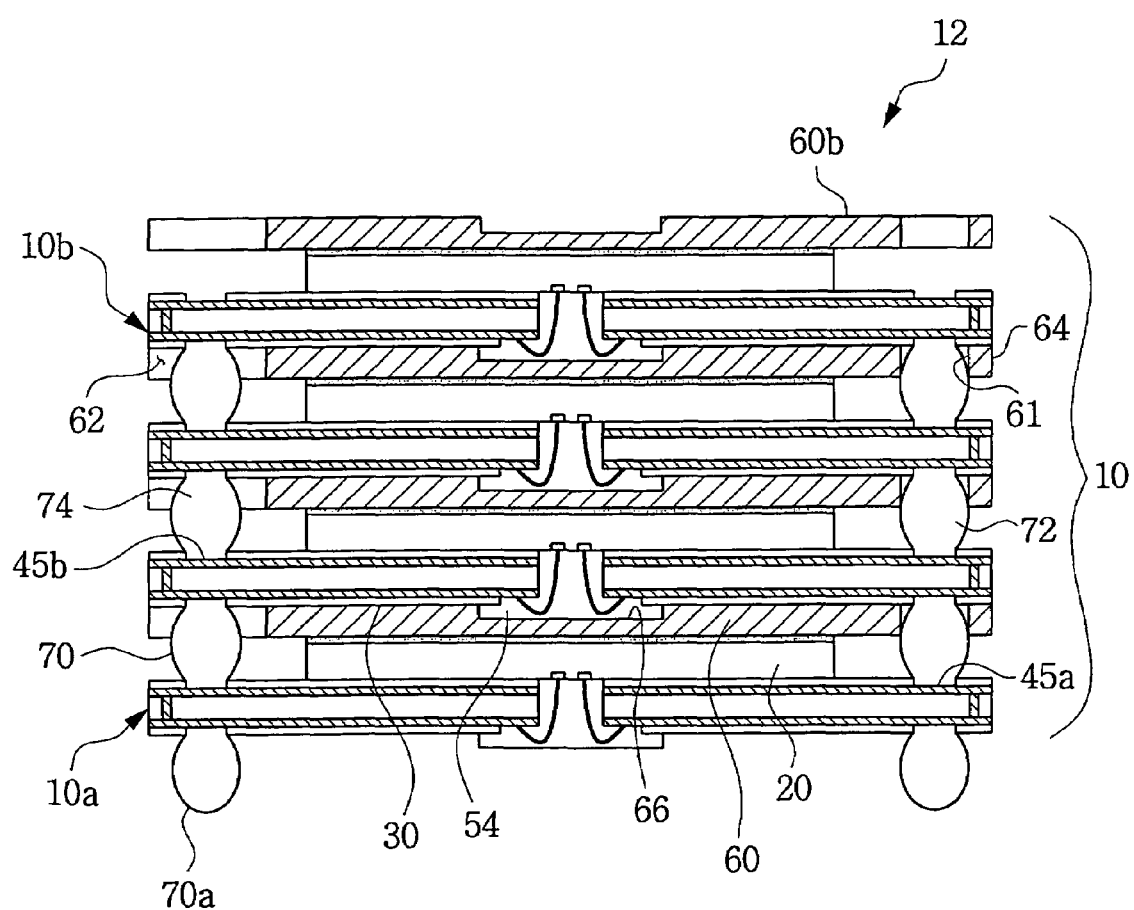
FIG. 3 is a cross-sectional view of a package stack formed by stacking semiconductor packages according to the first exemplary embodiment of the present invention.

FIG. 3 shows a package stack 12 formed by stacking semiconductor packages 10 according to the first exemplary embodiment of the present invention as described above. With reference to FIG. 3, the external contact terminals 70 of an upper semiconductor package are electrically connected with the contact pads 45a and 45b of the lower semiconductor package in the package stack 12 of the first exemplary embodiment, which is manufactured by stacking four semiconductor packages 10. In other words, the signal terminals 74 of the upper semiconductor package are separated from the heat spreader of the lower semiconductor package and connected with the signal contact pads 45b that are exposed to the indented parts of the heat spreader of the lower semiconductor package. In addition, the ground terminals 72 are connected with the inner sides of the ground holes 61 of the lower semiconductor package and, by insertion, to the ground contact pads 45a exposed to the ground holes 61 of the lower semiconductor package. Since the encapsulant 54 of the upper semiconductor package is inserted into the cavity 66 of the heat spreader of the lower semiconductor package, the lower surface of the board 30 of the upper semiconductor package is closely stacked on top of the heat spreader 60 of the lower semiconductor package. Although not shown in FIG. 3, the dummy ground terminals 76 of the upper semiconductor package are inserted into and connected with the dummy ground contact pads 45c exposed to the dummy ground holes 63 of the heat spreader 60 of the lower stack semiconductor package in the same way the ground terminals 72 are inserted into and connected to heat spreader 60. Consequently, the dummy ground terminals 76 are also connected with the inner side of the dummy ground holes 63 of the lower semiconductor package. In the case described above, the external contact terminals 70a of the lowest semiconductor package 10a are used as the external contact terminals of the package stack.

Accordingly, this arrangement enables the heat spreader 60 to form the indented part 62 corresponding to the signal terminal 74, and the semiconductor package 10 with the heat spreader 60 to be stacked by forming the ground holes 61 and the dummy ground holes 63 on the protruded parts 64. The heat spreader 60 is then connected with the ground terminals 72 and the dummy ground terminals 76 by stacking the semiconductor package 10.

Because the external contact terminals 70 of the upper stack semiconductor package form the metal shielding box around the peripheral part of the heat spreader 60 of the lower stack semiconductor package, this invention has the advantage of cutting off EMI between the semiconductor chip 20 and outside the chip 20, thereby easily achieving the EMI standard. Moreover, since the semiconductor chip 20 mounted on top of the board 30 is protected not by molding resin but by the heat spreader 60, and since the external contact terminals 70 and the outside of the semiconductor chip 20 are exposed to air, the characteristic of heat release is improved by providing eddy-forming areas. In other words, the grounded heat spreader 60 radically improves both the electrical characteristics and heat release characteristics.

According to the first exemplary embodiment of the present invention, although the package stack 12 has a structure stacking four semiconductor packages 10, the package stack embodied by stacking two or more semiconductor packages of the first embodiment is only a variant of the package stack of the first embodiment of the invention.

Figure 4:
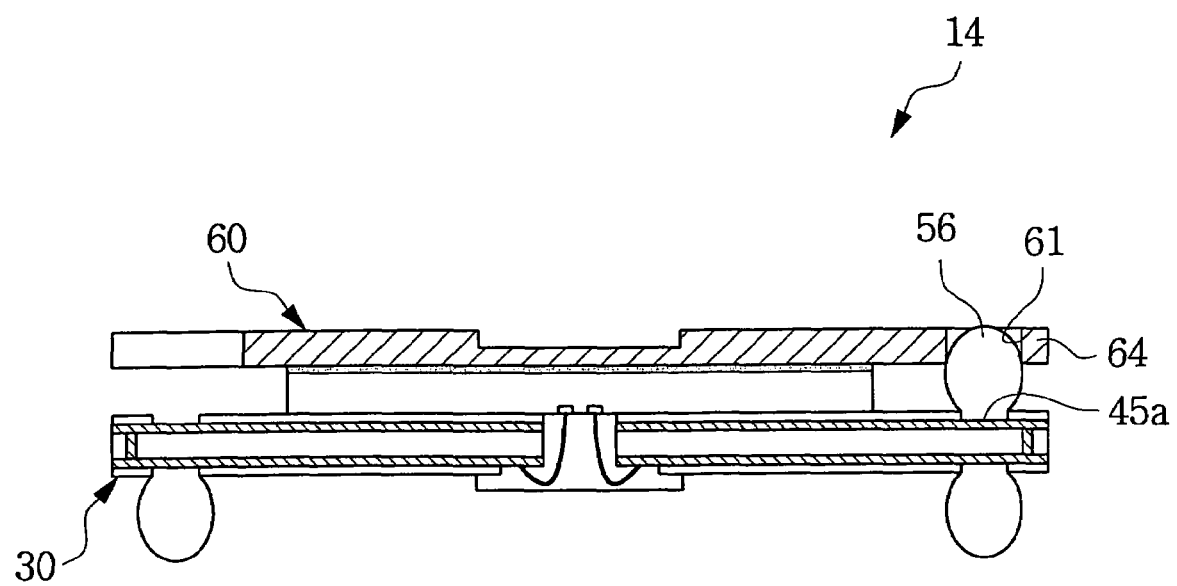
FIG. 4 is a cross-sectional view showing a semiconductor package, according to a second exemplary embodiment of the present invention in which a heat spreader is connected with the board by ground bumps.

Because the semiconductor package 10 shown in FIGS. 2A and 2B has a grounded structure by stacking without having the structure of the heat spreader 60 grounded to the board 30, the semiconductor package 10 can be formed by grounding the heat spreader 60 to the board 30 as shown in FIG. 4.

According to the second exemplary embodiment of the invention, referring to FIG. 4, a ground bump 56 is formed which electrically connects the ground contact pad 45a of the board and the protruded part 64 of the heat spreader in a semiconductor package 14. In addition, although not shown, a dummy ground bump is formed which electrically connects the dummy ground contact pad and the dummy protruded part. In the above case, solder balls are mainly used for the ground bump 56 and the dummy ground bump, but metal bumps such as nickel (Ni) or gold (Au) are also used for the same.

Figure 5:
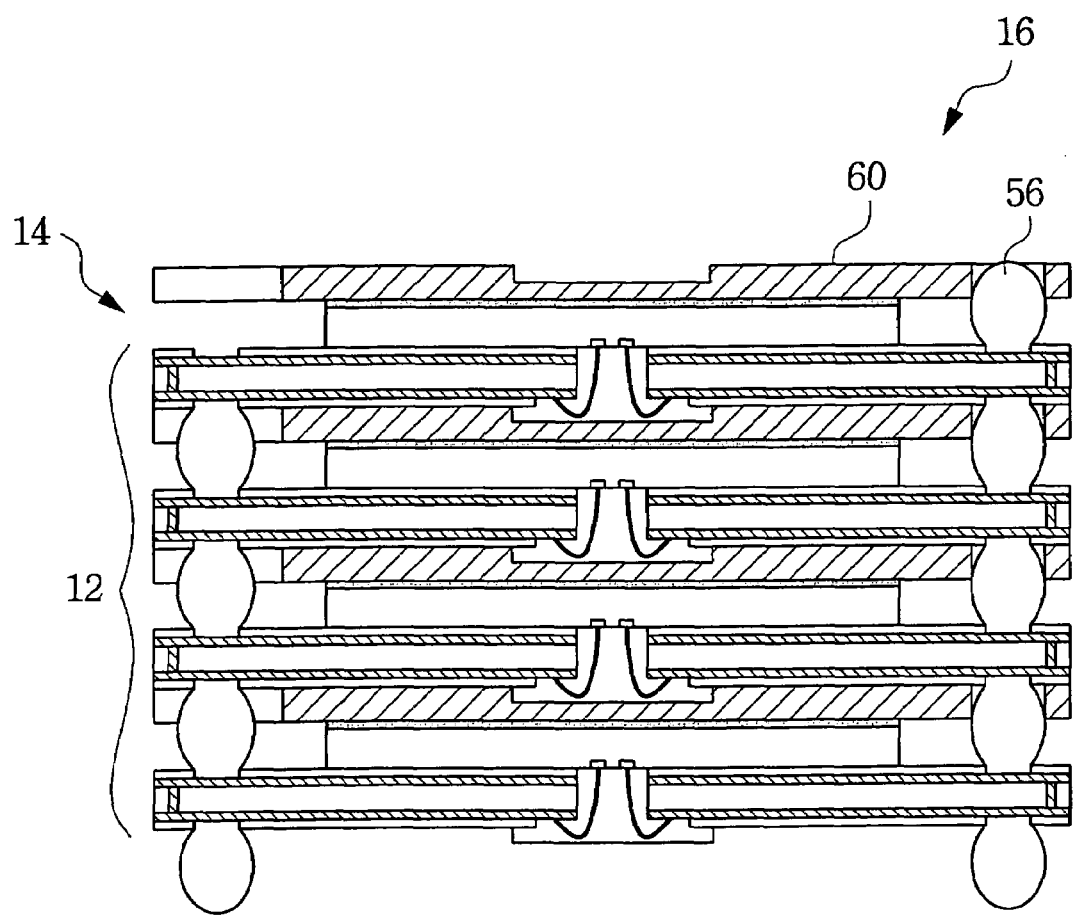
FIG. 5 is a cross-sectional view showing a semiconductor package according to the second exemplary embodiment of the present invention is stacked on top of at least one semiconductor package according to the first exemplary embodiment of the present invention.

FIG. 5 shows a package stack 16 of the second embodiment formed by using the semiconductor packages 10 and 14 according to the first and second embodiments. Referring to FIG. 5, the package stack 16 according to the second embodiment stacks three semiconductor packages 10 according to the first embodiment. Further, the package stack 16 stacks the semiconductor package 14 on top thereof. The package stack which stacks at least one semiconductor package according to the first embodiment and the semiconductor package according to the second embodiment on the top thereof is only a variant of the package stack according to the second embodiment.

The heat spreader 60 of the semiconductor package 14 shown in FIG. 5 on top of the package stack 16 according to the second embodiment is grounded, whereas the heat spreader 60b of the uppermost semiconductor package 10b on top of the package stack 12 shown in FIG. 3 according to the first embodiment is not grounded. Therefore, the heat spreader 60 of every semiconductor package of the package stack 16 in FIG. 5 has a grounded structure.

The semiconductor package according to the first and second embodiments of the invention has the structure that each facedown semiconductor chip is electrically connected between the board and the bonding wire. However, it is possible to embody the said semiconductor package as a flip chip bonding structure.

Figure 6:
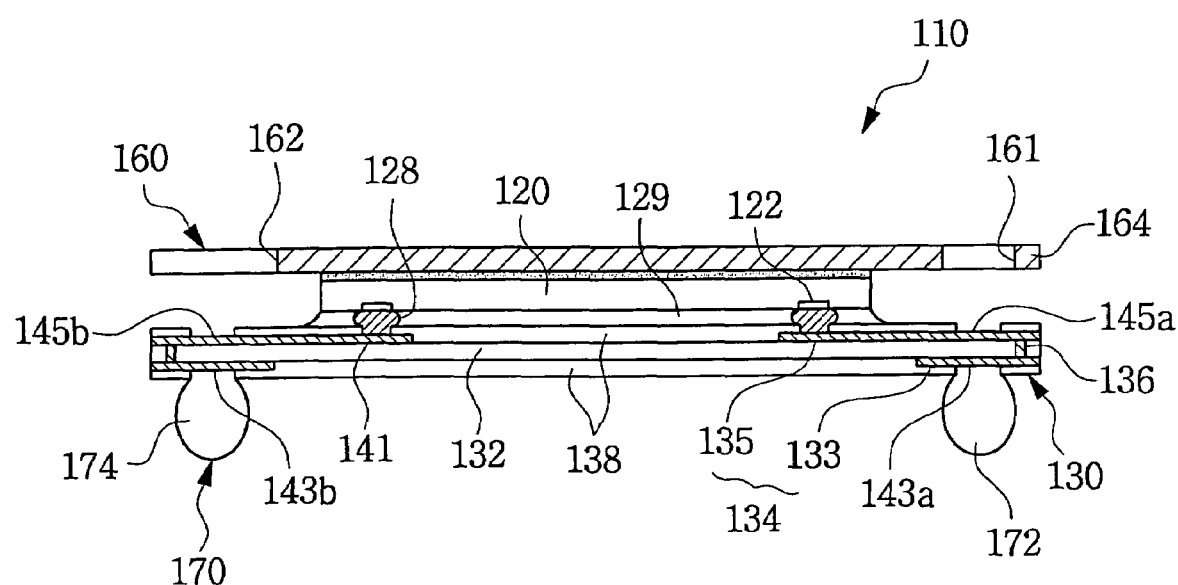
FIG. 6 is a plan view of a semiconductor package having a heat spreader according to a third exemplary embodiment of the present invention.

According to the third exemplary embodiment, referring to FIG. 6, a semiconductor chip 120 is flip chip bonded on the upper surface of a board 130, a heat spreader 160 is attached on the rear side of the semiconductor chip 120, and external contact terminals 170 are formed on the lower surface of the board 130. The flip chip bonded part is covered with epoxy resin 129 provided by the under-fill method.

More specifically, electrode bumps 128 are each attached to a bonding pad 122 for flip chip bonding in the semiconductor chip 120.

The board 130 may be a circuit board having metal wiring layer 134 on a substrate body 132. The board 130 may include a tape wiring board, a printed circuit board (PCB) or a ceramic board. Although there is an example of the metal wiring layer 134 being formed on both sides of the board 130 according to the third exemplary embodiment, it is also possible to form at least one or more metal wiring layers within the board 130. The substrate body 132 comprises upper and lower surfaces and its area is larger than the active face of the semiconductor chip 120. The metal wiring layer 134 is formed on the upper surface of the substrate body 132 and comprises an upper wiring layer 135 formed on the periphery of the upper surface of the substrate body 132 and a lower wiring layer 133 having ball pads 143a and 143b formed on the lower surface of the substrate body 132 corresponding to contact pads 145a and 145b. The lower wiring layer 133 and the upper wiring layer 135 are electrically connected with via holes 136 penetrating the substrate body 132. Further, the metal wiring layer 134 is protected from the outer environment by an insulated protection layer 138 formed on the metal wiring layer 134 excluding the substrate pad 141, the ball pads 143a and 143b, and contact pads 145a and 145b. Photo solder resist can be used for the insulated protection layer 138.

The invention according to the third embodiment has the same structure as the semiconductor package 10 of FIG. 1 according to the first embodiment of the invention excluding the structure forming the substrate pad 141 on the upper surface of the board 130 for flip chip bonding of the semiconductor chip 120. Therefore, the third embodiment of the invention will be sufficiently clear without further detailed description. The structural difference between the heat spreaders 60 and 160 of the above embodiments is that the center portion of the upper surface of the heat spreader 160 is flat without forming a cavity for the encapsulant to be inserted therein.

Figure 7:
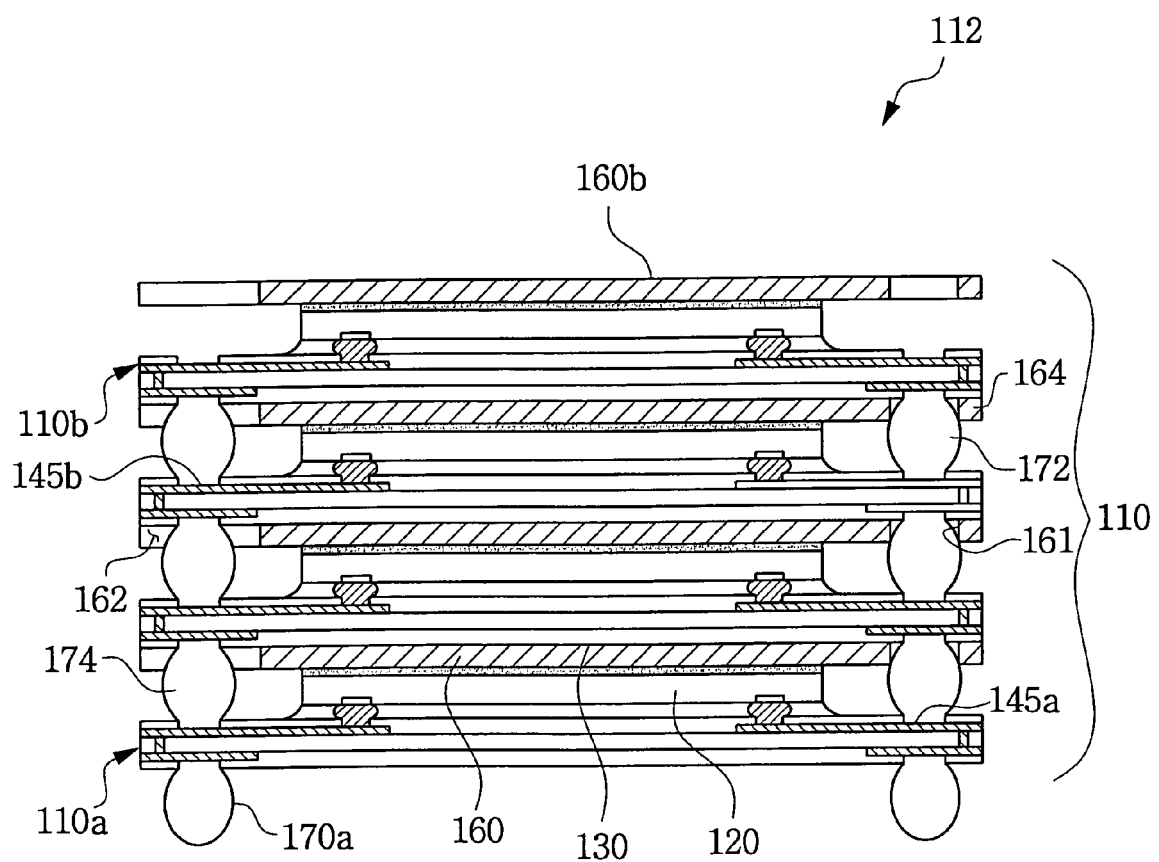
FIG. 7 is a cross-sectional view of a package stack formed by stacking semiconductor packages according to the third exemplary embodiment of the present invention.

FIG. 7 shows the semiconductor packages stacked in three dimensions according to the third embodiment of the invention. With reference to FIG. 7, a package stack 112 according to the third embodiment is produced by stacking four semiconductor packages 120 in three dimensions. Further, signal terminals 174 of an upper semiconductor package are remotely attached to signal contact pads 145b exposed by the indented parts of the heat spreader of the lower semiconductor package. The ground terminals 172 of the upper semiconductor package are connected to the ground contact pads 145a exposed to the ground holes 161 of the heat spreader of the lower semiconductor package by insertion, so that the upper semiconductor package is connected to the inner face of the ground holes 161 of the lower semiconductor package. In this case, the lower surface of the board 130 of the upper semiconductor package adheres closely to the heat spreader 160 of the lower stack semiconductor package. Further, although not shown, the dummy ground terminals of the upper semiconductor package are connected to the dummy ground contact pads exposed to the dummy ground holes of the lower semiconductor package by insertion, so that the dummy ground terminals of the upper semiconductor package are also connected with the inner side of the dummy ground holes of the lower stack semiconductor package. The external contact terminals 170a of the bottom semiconductor package act as the external contact terminals of the package stack.

The package stack 112 according to the third embodiment has the same structure as the package stack 12 according to the first embodiment except that the structure that the semiconductor chip 120 is flip chip bonded on the board 130, therefore the effects of the above two package stacks are identical.

According to the third exemplary embodiment of the invention, the semiconductor package 110 has a grounded structure by stacking. Therefore, the heat spreader 160 can be grounded to the board 130, as shown in FIG. 8.

Figure 8:
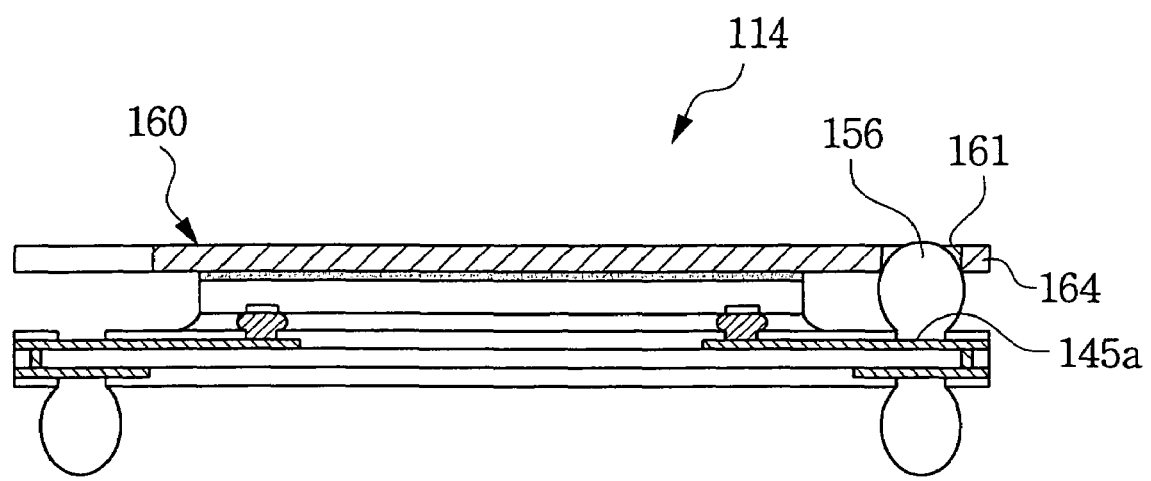
FIG. 8 is a cross-sectional view showing a semiconductor package according to a fourth exemplary embodiment of the present invention, in which a heat spreader is connected with the board by ground bumps.

With reference to FIG. 8, a semiconductor package 114 according to the fourth exemplary embodiment of the invention has a ground bump 156 electrically connecting the ground contact pad 142a of the board and the protruded part 164 of the heat spreader. Although not shown, the semiconductor package 114 also has a dummy ground bump electrically connecting the dummy ground contact pad and dummy protruded part.

Figure 9:
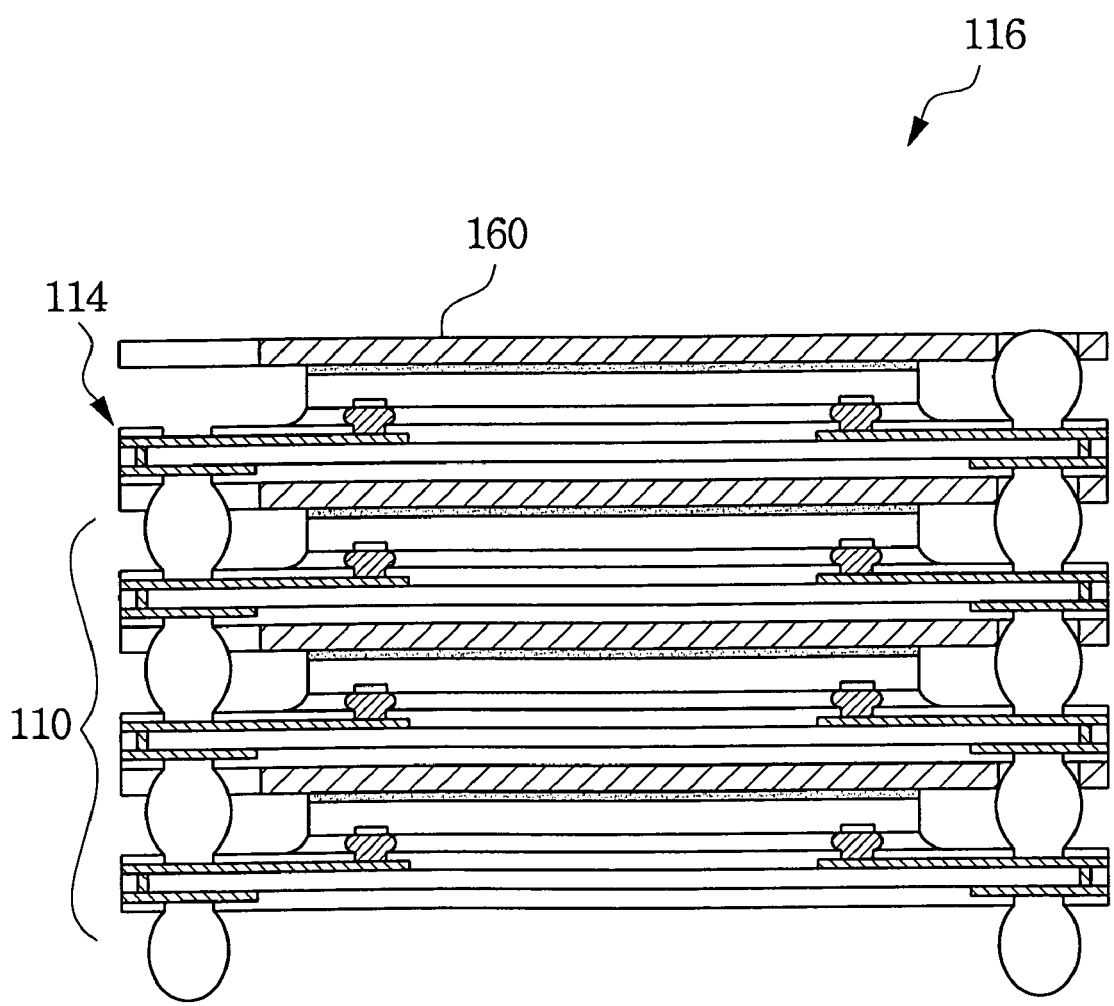
FIG. 9 is a cross-sectional view showing the package according to the fourth exemplary embodiment of the present invention is stacked on top of at least one semiconductor package according to the third exemplary embodiment of the present invention.

FIG. 9 shows a package stack 116 according to the fourth exemplary embodiment. Referring to FIG. 9, the package stack 116 according to the fourth embodiment stacks three semiconductor packages 110 according to the third embodiment, and one semiconductor package 114 according to the fourth embodiment on the top thereof.

While the heat spreader 160b of the uppermost semiconductor package 110b of the package stack 112 shown in FIG. 7 according to the third embodiment is not grounded, the heat spreader 160 of the uppermost semiconductor package 114 of the package stack 116 shown in FIG. 9 according to the fourth embodiment is grounded. Therefore, all heat spreaders 160 of the package stack 116 in FIG. 9 are grounded.

The semiconductor packages according to the first through fourth embodiments of the invention attach the heat spreader to the rear side of the semiconductor chip mounted as a facedown type on the upper surface of the board. However, the semiconductor packages may also attach the heat spreader to the lower surface of the board so that they can be grounded and stacked.

Figure 10:
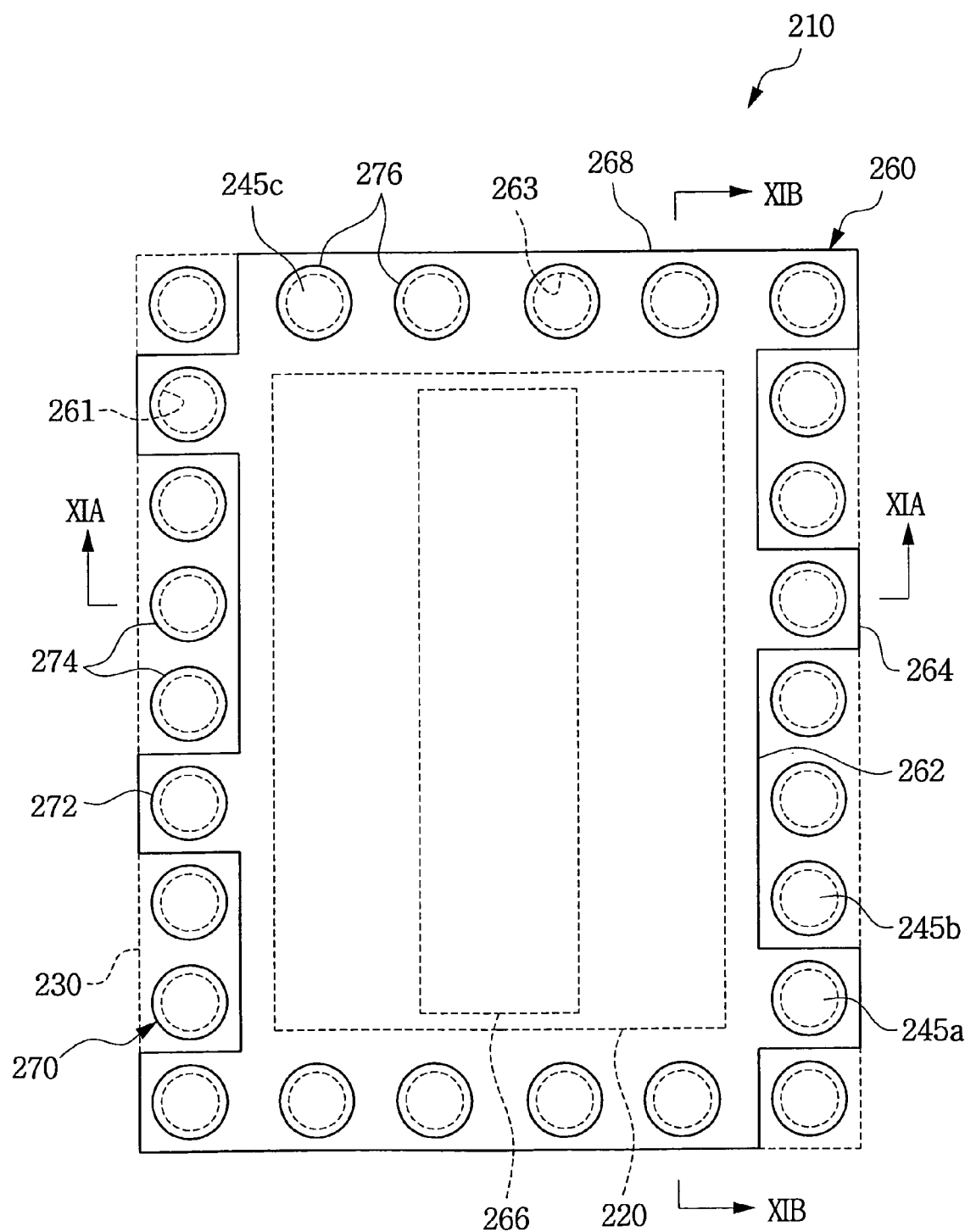
FIG. 10 is a plan view of a semiconductor package having a grounded heat spreader according to a fifth exemplary embodiment of the present invention.
Figure 11A:
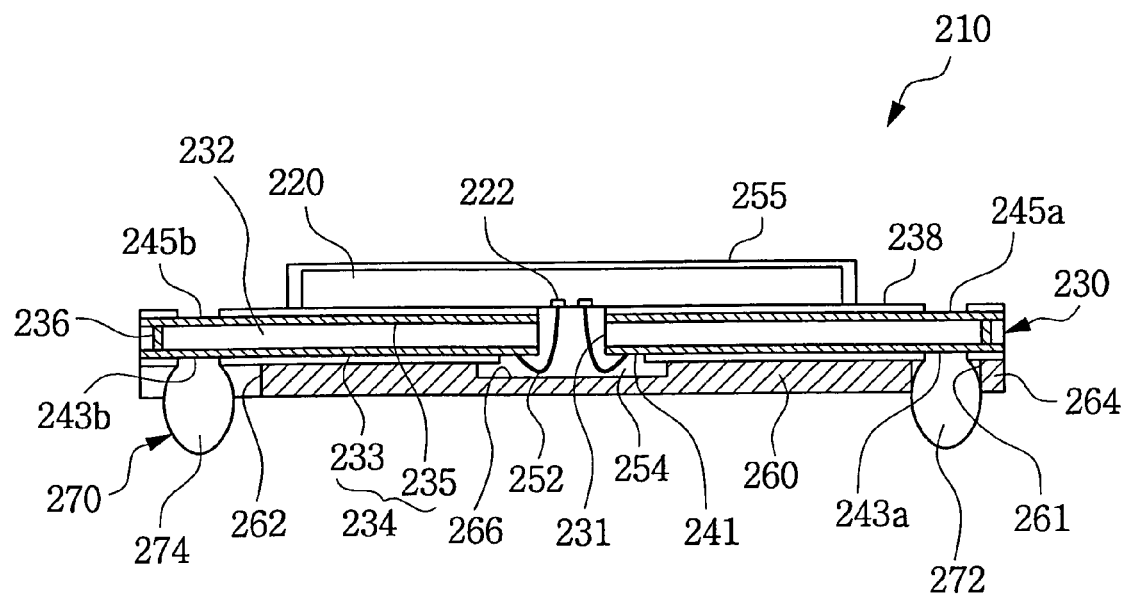
FIG. 11A is a cross-sectional view taken along the line XIA-XIA in FIG. 10.
Figure 11B:
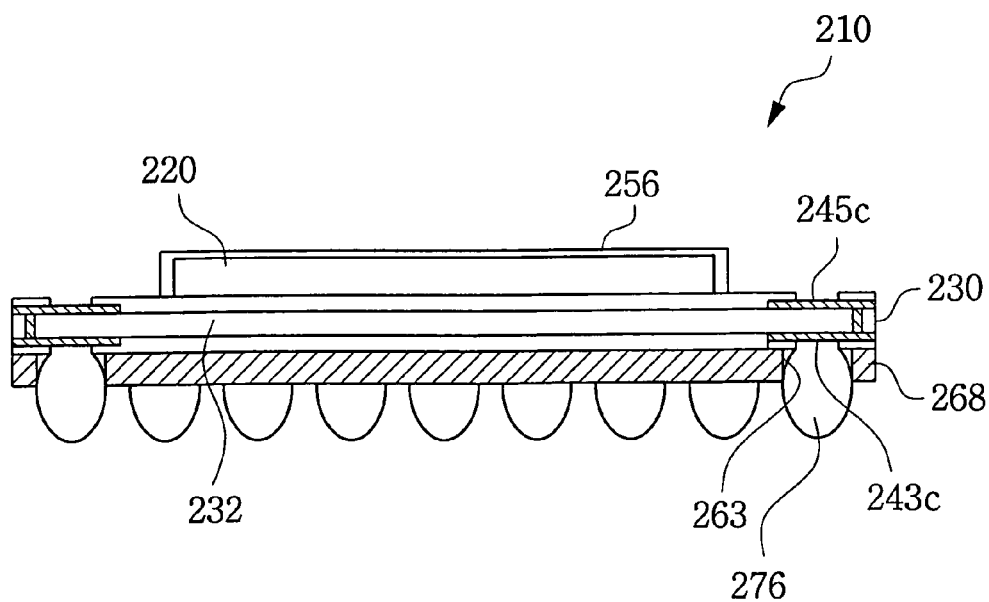
FIG. 11B is a cross-sectional view taken along the line XIB-XIB in FIG. 10.

Referring to FIGS. 10 through 11B, a semiconductor package 210 according to the fifth embodiment of the invention is of facedown type and electrically connected to a board 230. Further, the active surface of a semiconductor chip 220 faces the upper surface of the board 230. The heat spreader 260 and the external contact terminals 270 are attached to the lower surface of the board 230.

More specifically, the semiconductor chip 220 is a center pad type, of which electrode pads 222 are formed on the center of the active surface.

The board 230 has a window in its center to expose the electrode pads 222 of the semiconductor chip and has a metal wiring layer 234 on both sides.

The heat spreader 260 attached to the lower surface of the board 230 conducts heat generated in operation of the semiconductor chip 220 through the lower surface of the board 230. It is preferable to choose metals with good heat and electrical conductivity for the heat spreader 260, e.g. copper (Cu) and aluminum (Al), and a size corresponding to that of the board 230. The heat spreader 260 is attached to the lower surface of the board 230 by non-conductive adhesive.

The electrode pads 222 exposed by the window 231 and substrate pads 241 of the board 230 are electrically connected to each other by bonding wires 252. The electrode pads 222 of the semiconductor chip exposed by the window 231, the substrate pads 241 and the bonding wires 252 are protected from the outer environment by a first resin encapsulant 254 formed by a molding resin. Further, the semiconductor chip 220 mounted on the upper surface of the board 230 is also encapsulated by a second resin encapsulant 255. However, if necessary, the two above-mentioned resin encapsulant parts can be omitted.

An external contact terminal 270 is formed on each ball pad 243a, 243b and 243c. A solder ball is mainly used for the external contact terminal 270, but a metal bump such as nickel (Ni) or gold (Au) is also used for the same.

The heat spreader 260 according to the fifth exemplary embodiment of the invention is attached to the lower surface of the board 230 by non-conductive adhesive (not shown) for the purpose of insulating the heat spreader from the lower wiring layer. On the edge of the heat spreader 260 are formed indented parts 262 where a signal terminal 274 protrudes, and protruded parts 264 covering the contact pads 243a. Further, on the protruded parts 264 is formed a ground hole 261 where a ground terminal 272 protrudes. Consequently, the ground terminals 272 are connected with the inner side of the ground holes 261. Further, in the center part of the heat spreader is formed a groove 266 with a predetermined depth into which the first resin encapsulant 254 is inserted. If the first resin encapsulant is not formed, the groove with predetermined depth is still formed, in the center part of the upper surface of the heat spreader corresponding to the window to keep the heat spreader from contacting the bonding wires.

According to the fifth exemplary embodiment of the invention, the ground and signal terminals 272 and 274 are formed on the peripheral parts of opposing sides of the board 230. For the purpose of forming the metal shielding box, dummy ground terminals 276 are formed on both sides of the board 230 that do not have ground and signal terminals 272, 274. Further, dummy ground contact pads 245c are formed on the upper surface of the substrate body 232 above the dummy ground pads 243c. The dummy ground pads 243c and the dummy ground contact pads 245c are electrically connected through dummy via holes 237. Dummy protruded parts 268 are formed on the outer side of the heat spreader 260, and dummy ground holes 263 are formed in the dummy protruded parts 268. Further, the dummy ground terminals 276 are attached to the inner side of the dummy ground holes 263.

Figure 12:
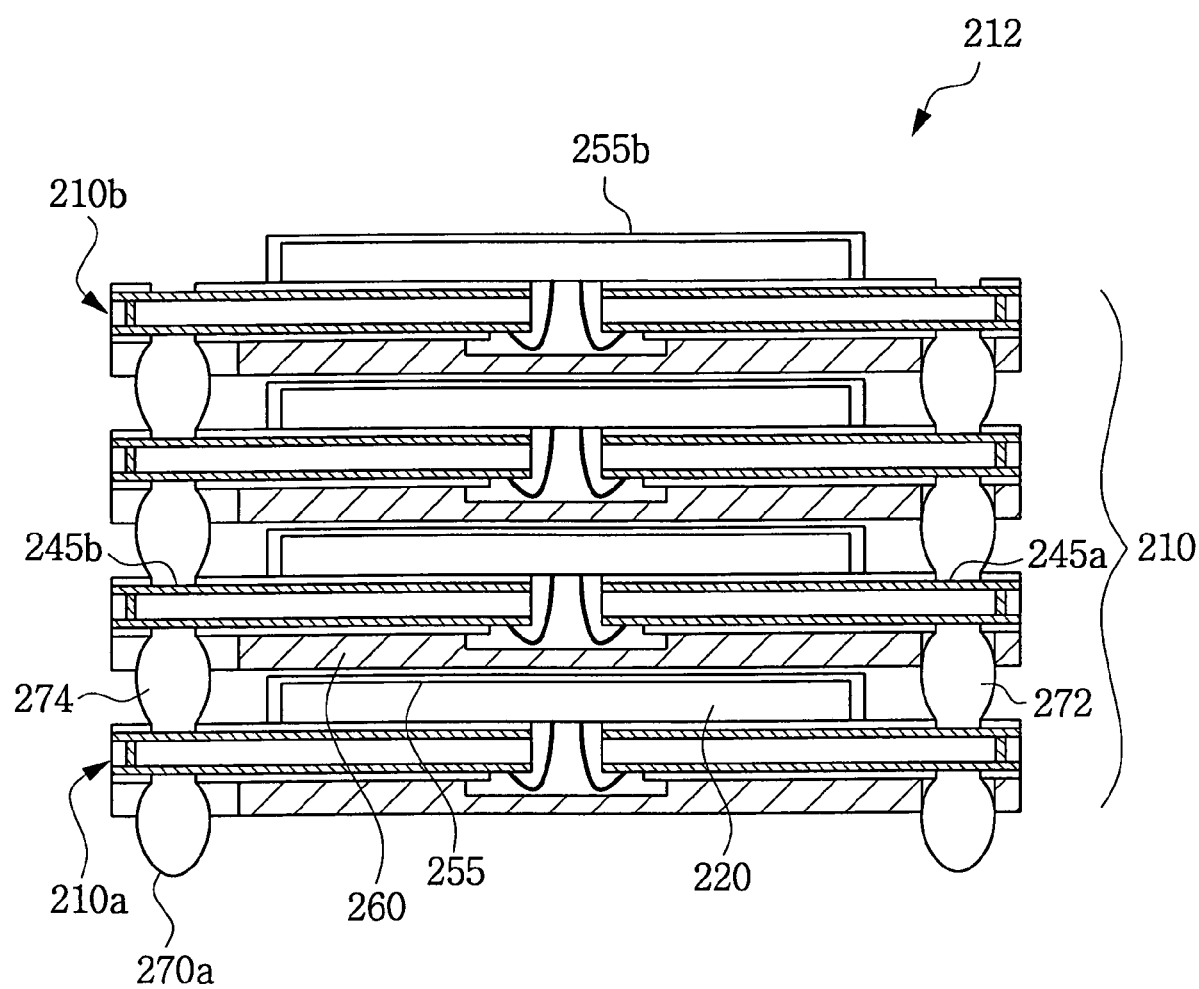
FIG. 12 is a cross-sectional view of a package stack formed by stacking semiconductor packages according to the fifth exemplary embodiment of the present invention.

FIG. 12 shows a package stack 212 stacking the semiconductor packages 210 according to the fifth embodiment of the invention. Referring to FIG. 12, the package stack 212 stacks four semiconductor packages 210 according to the fifth embodiment in three dimensions. Further, the signal terminals 274 of an upper semiconductor package are connected to signal contact pads 245b of the lower semiconductor package while the ground terminals 272 of the upper semiconductor package are connected to ground contact pads 245a of the lower semiconductor package so that the heat spreader 260 of the upper semiconductor package is stacked closely above the second resin encapsulant 255. Although not shown, the dummy ground terminals 276 of the upper semiconductor package are also connected to the dummy ground contact pads 24 and 56 of the lower semiconductor package. The external contact terminals 270a of the bottom semiconductor package 210a act as the external contact terminals of the package stack. In this embodiment of the invention, adhesive can be used to keep the heat spreader 260 stable on the second resin encapsulant 255.

According to the fifth embodiment of the invention, the heat spreader 260, ground terminals 272 connected to the said heat spreader, and dummy ground terminals 276 surround the semiconductor chip 220 and form a metal shielding box. Therefore, this invention has the advantage of cutting off EMI between the semiconductor chip 220 and outside the chip 220, thereby easily achieving the EMI standard. That is, the heat release and electrical characteristics are expected to be improved by grounding the heat spreader 260.

According to the fifth embodiment, a heat spreader can be attached to the upper surface of the second resin encapsulant part 255b of the top semiconductor package 210b. Moreover, the ground contact pads and the dummy contact pads of the top semiconductor package can also be grounded by the ground bumps and the dummy ground bumps respectively. The above variants of the invention are also in the scope of the invention.

Figure 13:
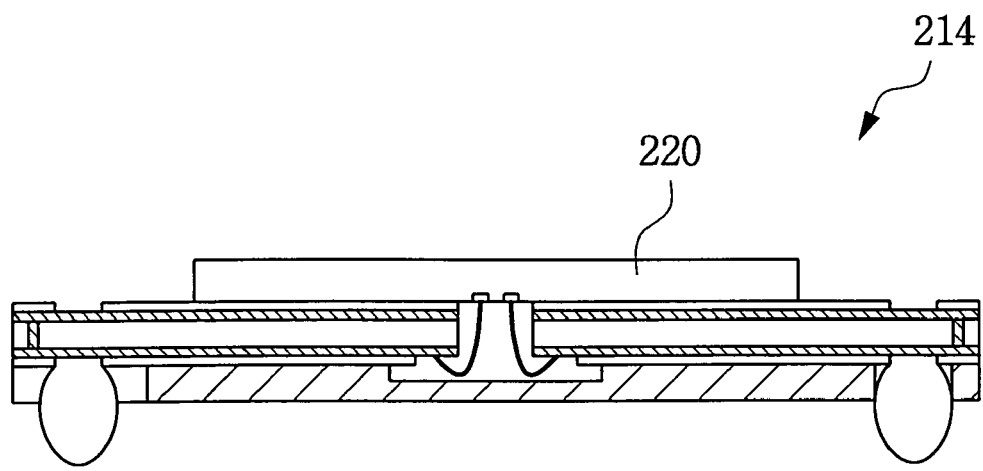
FIG. 13 is a plan view of a semiconductor package having a grounded heat spreader according to a sixth exemplary embodiment of the present invention.
Figure 14:
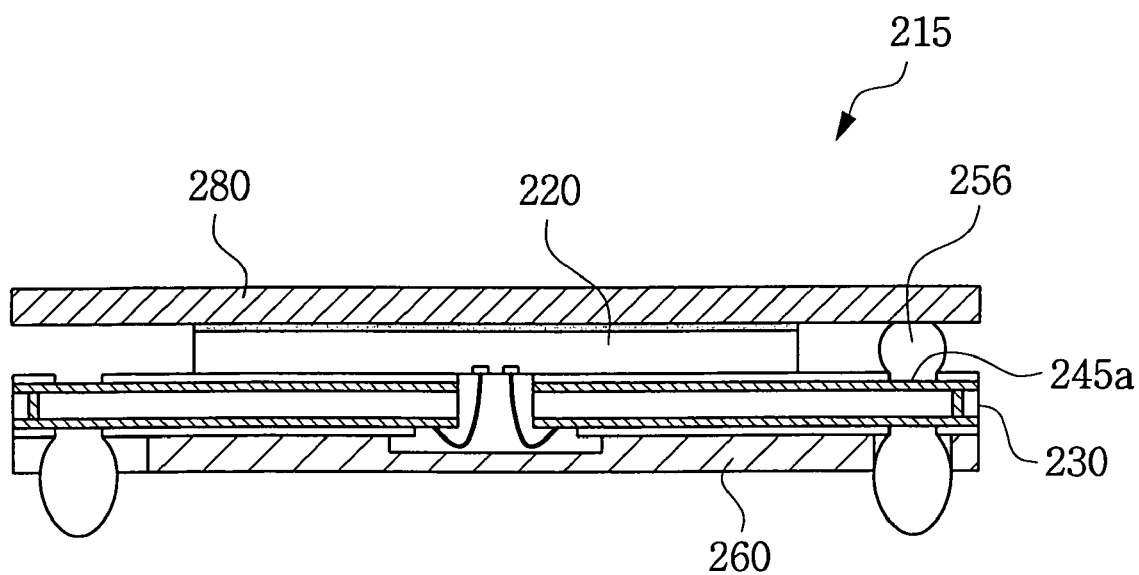
FIG. 14 is a plan view of a semiconductor package having upper and lower grounded heat spreaders according to a seventh exemplary embodiment of the present invention.

As shown in FIGS. 13 and 14, the second resin encapsulant part can be omitted. Further, the first resin encapsulant can be omitted because the groove of the heat spreader protects the wire bonding portion.

Referring to FIG. 13, a semiconductor package 214 according to the sixth embodiment has the same structure as the semiconductor package 210 according to the fifth embodiment except that the second resin encapsulant is not formed on the semiconductor package 214.

Referring to FIG. 14, a semiconductor package 215 according to the seventh embodiment has the same structure as the semiconductor package 214 according to the sixth embodiment except that a heat spreader 280 is attached to the rear side of the semiconductor chip 220. Hereafter, the "first heat spreader" refers to the heat spreader 260 attached to the lower surface of the board 230 and the "second heat spreader" refers to the heat spreader 280 attached to the rear side of the semiconductor chip 220. The semiconductor package 215 according to the seventh embodiment connects the ground contact pads 245a of the board and ground bumps 256 of the second heat spreader 280, and is thereby grounded. Further, dummy ground contact pads and the second heat spreader 280 are connected with dummy ground bumps and grounded.

Figure 15:
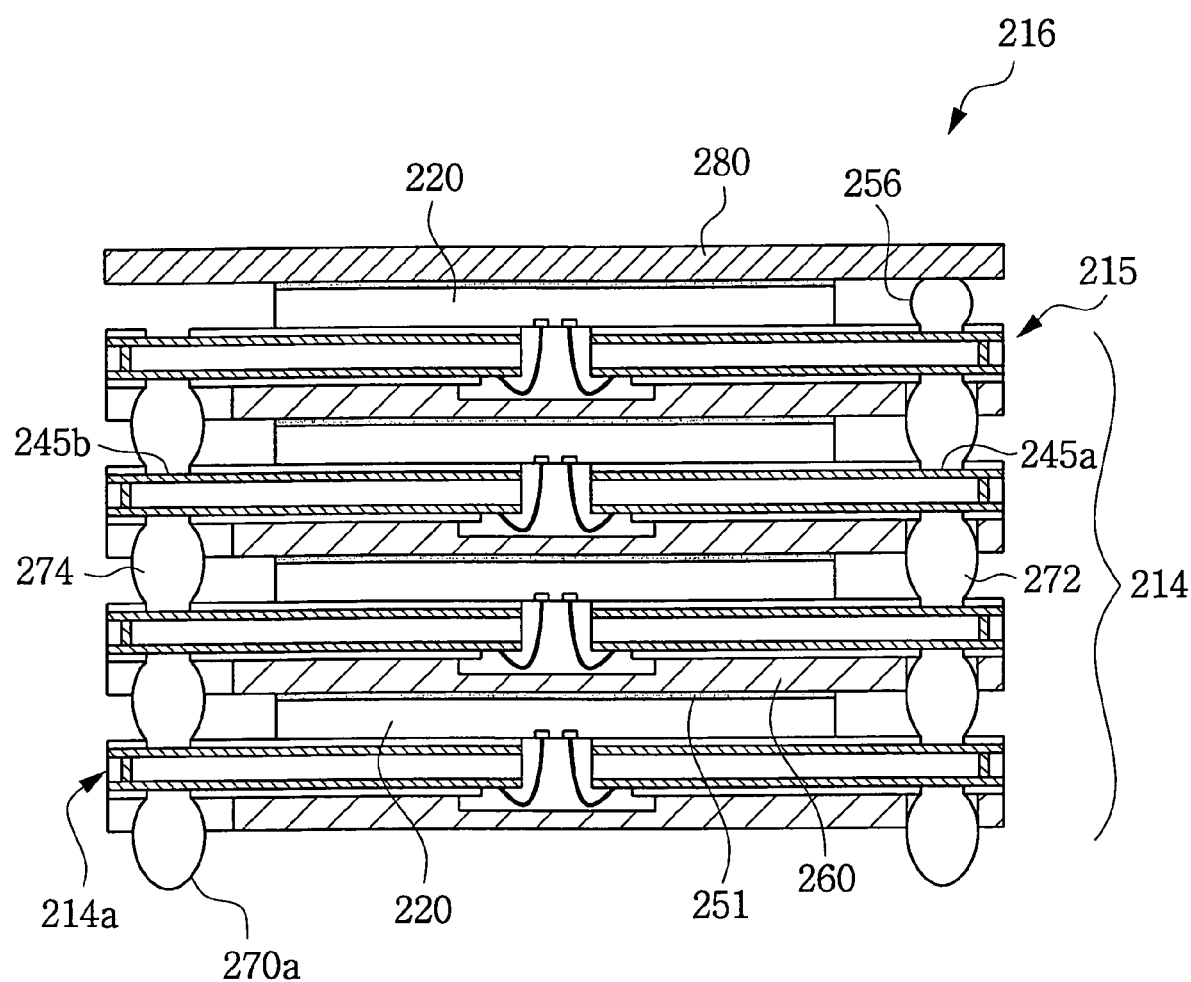
FIG. 15 is a cross-sectional view showing the package according to the seventh exemplary embodiment of the present invention is stacked on top of at least one semiconductor package according to the sixth exemplary embodiment of the present invention.

FIG. 15 shows a package stack 216 using the semiconductor packages 214 and 215 according to the sixth and seventh embodiments. Referring to FIG. 15, the package stack 216 stacks three semiconductor packages 214 according to the sixth embodiment, and further stacks one semiconductor package 215 according to the seventh embodiment on the top thereof. The signal terminals 274 of an upper semiconductor package are attached to the signal contact pads 245b of the lower semiconductor package, and the ground terminals 272 of the upper semiconductor package are attached to the ground contact pads 245a of the lower semiconductor package. The heat spreader 260 of the upper semiconductor package is stacked on the semiconductor chip 220 of the lower semiconductor package. Further, although not shown, the dummy ground terminals of the upper semiconductor package are attached to the dummy ground contact pads of the lower semiconductor package. The external contact terminals 270a of the bottom semiconductor package 214a of the package stack are used as external contact terminals.

According to the sixth embodiment of the invention, the semiconductor chip 220 exposed to the upper surface of the board 230 is protected from the outer environment because the outer side of the semiconductor chip 220 is surrounded by the first heat spreader 260 and the external contact terminals 270.

Figure 16:
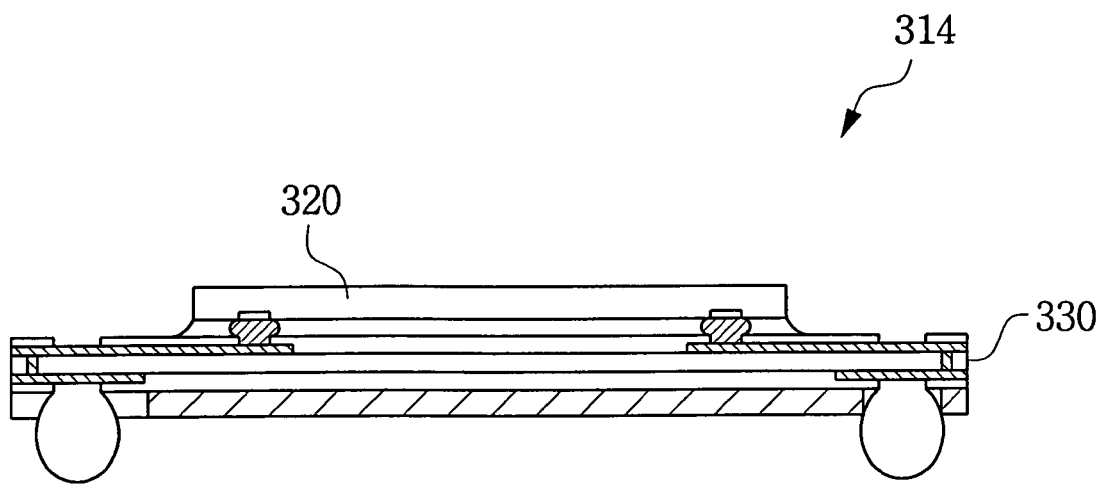
FIG. 16 is a plan view of a semiconductor package having a grounded heat spreader according to an eighth exemplary embodiment of the present invention.
Figure 17:
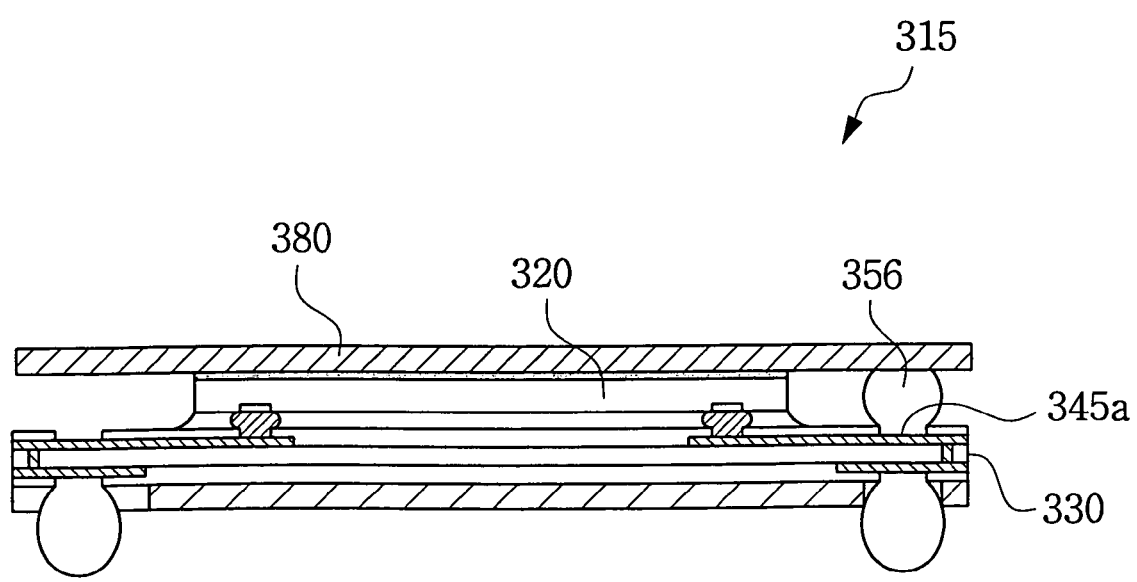
FIG. 17 is a plan view of a semiconductor package having upper and lower grounded heat spreader according to a ninth exemplary embodiment of the present invention.

According to the fifth through seventh embodiments of the invention, the facedown semiconductor chips are electrically connected with the board and the bonding wires. However, they may also have a flip chip bonding structure as shown in FIGS. 16 and 17. Referring to FIG. 16, a semiconductor package 314 according to the eighth embodiment has the same structure as the semiconductor package 214 according to the sixth embodiment except that a semiconductor chip 320 has the structure of flip chip bonding on a board 330. Referring to FIG. 17, a semiconductor package 315 according to the ninth embodiment has the same structure as the semiconductor package 215 according to the seventh embodiment except that the semiconductor chip 320 has the structure of flip chip bonding on the board 330. Therefore, the effects of the semiconductor packages 314 and 315 according to the eighth and ninth embodiments are the same as that of semiconductor packages according to the sixth and seventh embodiments, respectively.

Figure 18:
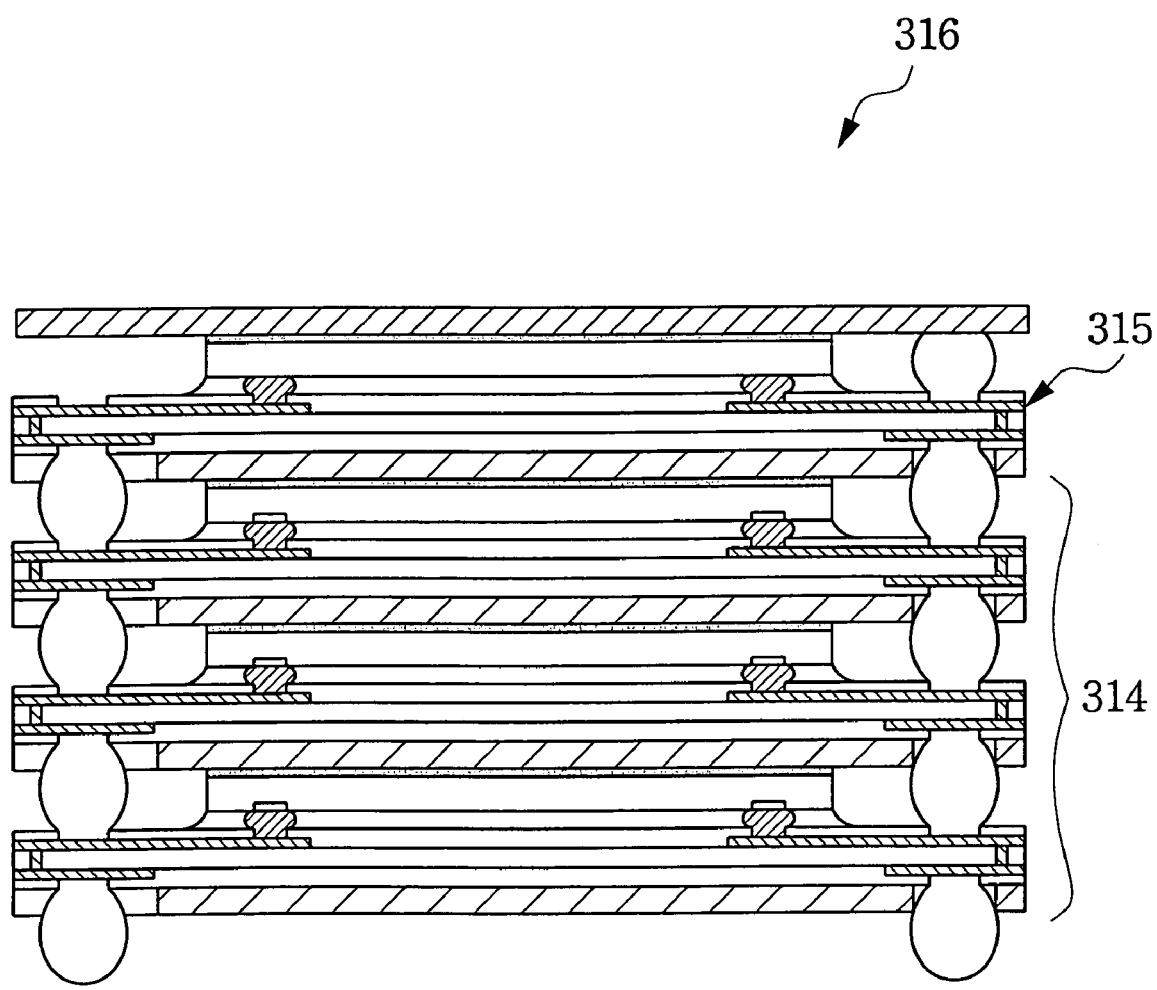
FIG. 18 is a cross-sectional view showing the package according to the ninth exemplary embodiment of the present invention is stacked on top of at least one semiconductor package according to the eighth exemplary embodiment of the present invention.

FIG. 18 shows a package stack 316 stacking the semiconductor packages 314 and 315 according to the eighth and ninth embodiments of the invention. Referring to FIG. 18, the package stack 316 stacks three semiconductor packages 314 according to the eighth embodiment, and one semiconductor package 315 according to the ninth embodiment on the top thereof. Therefore, the effect of the package stack 316 shown in FIG. 18 is the same as that of the package stack 216 shown in FIG. 15.

Various illustrative implementations of the present invention have been described. However, one of ordinary skill in the art will see that additional implementations are also possible and within the scope of the present invention. Accordingly, the present invention is not limited only to those implementations described above.

What is claimed is:

1. A semiconductor package, comprising:
   a semiconductor chip;
   a board having an upper surface attached to an active surface of the chip; and
   a heat spreader attached to a back surface of the chip,
   wherein the board includes ground and signal contact pads on the upper surface, and
   wherein the heat spreader includes ground holes directly overlying the ground contact pads.

2. The package of claim 1, wherein the heat spreader is shaped not to overlie the signal contact pads.

3. The package of claim 1, wherein the semiconductor chip is a center-pad type chip including a plurality of bonding pads formed along a center portion of the active surface.

4. The package of claim 3, wherein the board further includes:
   a window on a center portion of the board, the window positioned on the board to expose the bonding pads on the active surface of the chip;
   board pads formed on a lower surface of the board and arranged near the window;
   bonding wires connecting the board pads with the bonding pads on the chip.

5. The package of claim 4, further including an encapsulant sealing the window and protecting the bonding pads on the chip and the bonding wires.

6. The package of claim 1, wherein external contact terminals protrude from a lower surface of the board, the external contact terminals protruding a height greater than the total combined height of the chip and heat spreader.

7. The package of claim 6, wherein a greatest horizontal diameter of the external contact terminals is sized to fit an inner diameter of the ground holes in the heat spreader.

8. The package of claim 5, wherein the heat spreader includes a cavity formed on a surface opposite the chip, sized for insertion of an encapsulant of another semiconductor package.

9. The package of claim 1, further including ground bumps connecting the ground contact pads on the board to the ground holes in the heat spreader.

10. The package of claim 9, wherein a predetermined number of ground bumps are dummy ground bumps.

11. A multi-chip semiconductor chip package, comprising:
an upper semiconductor chip package stacked on a lower semiconductor chip package, wherein each semiconductor chip package includes a board having an active surface of a semiconductor chip attached to an upper surface of the board and a heat spreader attached to a back surface of the semiconductor chip; and
external contact terminals on the upper package connected to ground and signal contact pads on the board of the lower package,
wherein the heat spreader of the lower package includes ground holes overlying the ground contacts and through which the external contact terminals connected to the ground contact pads are inserted, the ground holes contacting those terminals.

12. The multi-chip package of claim 11, including the heat spreader of the lower package shaped not to overlie the signal contact pads on the board of the lower package.

13. The multi-chip package of claim 12, wherein the semiconductor chip in each upper and lower package is a center-pad type chip including a plurality of bonding pads formed along a center portion of the active surface.

14. The multi-chip package of claim 13, wherein the board in each upper and lower package further includes:
a window on a center portion of the board, the window positioned on the board to expose the bonding pads on the active surface of the chip;
board pads formed on a lower surface of the board and arranged near the window;
bonding wires connecting the board pads with the bonding pads on the chip.

15. The multi-chip package of claim 14, each upper and lower package further includes an encapsulant sealing the window and protecting the bonding pads on the chip and the bonding wires.

16. The multi-chip package of claim 11, wherein the external contact terminals protrude from a lower surface of the board in the upper package, the external contact terminals protruding a height greater than the total combined height of the chip and heat spreader.

17. The multi-chip package of claim 16, wherein external contact terminals protrude from a lower surface of the board of the lower package, the external contact terminals protruding a height greater than the total combined height of the chip and heat spreader.

18. The multi-chip package of claim 17, wherein a greatest horizontal diameter of the external contact terminals is sized to fit an inner diameter of the ground holes in the heat spreaders.

19. The multi-chip package of claim 15, wherein the heat spreader in each upper and lower package includes a cavity formed on a surface opposite the chip, the cavity sized for insertion of an encapsulant of an upper package.

20. The multi-chip package of claim 11, further including ground bumps connecting the ground contact pads on the board of the upper package to the ground holes in the heat spreader of the upper package.

21. The multi-chip package of claim 20, wherein a predetermined number of ground bumps are dummy ground bumps.

22. The package of claim 1, wherein the semiconductor chip is a flip-chip type chip, where the chip includes bonding pads on the active surface flip-chip bonded to the upper surface of the board using bonding bumps.

23. The package of claim 22, including ground bumps connecting the ground contact pads on the upper surface of the board to the ground holes in the heat spreader.

24. The package of claim 23, wherein a predetermined number of ground bumps are dummy ground bumps.

25. The multi-chip package of claim 11, wherein the semiconductor chip in each upper and lower package is a flip-chip type chip, where the chip includes bonding pads on the active surface flip-chip bonded to the upper surface of the board using bonding bumps.

26. The multi-chip package of claim 25, including ground bumps connecting the ground contact pads on the upper surface of the board of the upper package to the ground holes in the heat spreader of the upper package.

27. The multi-chip package of claim 26, wherein a predetermined number of ground bumps are dummy ground bumps.

28. A semiconductor chip package, comprising:
a semiconductor chip;
a board, the board having an upper surface attached to an active surface of the chip;
external ground and signal contact terminals protruding from a lower surface of the board; and
a heat spreader attached to the lower surface of the board, wherein the heat spreader includes ground holes through which the external ground contact terminals are inserted and contact the ground holes.

29. The package of claim 28, wherein the heat spreader is shaped to not overlie the external signal contact terminals.

30. The package of claim 29, the board further including ground and signal contact pads on the upper surface of the board.

31. The package of claim 29, wherein the semiconductor chip is a center-pad type chip including a plurality of bonding pads formed along a center portion of the active surface.

32. The package of claim 31, wherein the board further includes:
a window on a center portion of the board, the window positioned on the board to expose the bonding pads on the active surface of the chip;
board pads formed on the lower surface of the board and arranged near the window;
bonding wires connecting the board pads with the bonding pads on the chip.

33. The package of claim 32, further including an encapsulant sealing the window and protecting the bonding pads on the chip and the bonding wires.

34. The package of claim 28, wherein the external ground and signal contact terminals protrude from the lower surface of the board a height greater than the total combined thickness of the chip and the heat spreader.

35. The package of claim 28, wherein a greatest horizontal diameter of the external ground contact terminals is sized to fit an inner diameter of the ground holes in the heat spreader.

36. The package of claim 33, wherein the heat spreader includes a cavity formed on a surface facing the lower surface of the board, the cavity sized for insertion of the encapsulant.

37. The package of claim 30, further including a chip-side heat spreader, the chip-side heat spreader attached to a back surface of the semiconductor chip.

38. The package of claim 37, wherein the chip-side heat spreader includes ground holes overlying the ground contact pads on the upper surface of the board.

39. The package of claim 38, further including ground bumps connecting the ground holes in the chip-side heat spreader to the ground contact pads on the upper surface of the board.

40. The package of claim 39, wherein a predetermined number of the ground bumps are dummy ground bumps.

41. A multi-chip semiconductor chip package, comprising:
an upper semiconductor chip package stacked on a lower semiconductor chip package, wherein each semiconductor chip package includes a board having an active surface of a semiconductor chip attached to an upper surface of the board and a heat spreader attached to a lower surface of the board; and
external ground and signal contact terminals on the lower surface of the board of the upper package connected to ground and signal contact pads on the upper surface of the board of the lower package,
wherein the heat spreader of the upper package includes ground holes overlying the external ground contact terminals of the upper package and overlying the ground contact pads of the lower package,
and the external ground contact terminals of the upper package are inserted through and connected with the ground holes of the heat spreader of the upper package.

42. The multi-chip package of claim 41, including the heat spreader of the upper package shaped not to overlie the external signal contact terminals of the upper package and the signal contact pads of the lower package.

43. The multi-chip package of claim 42, wherein the semiconductor chip in each upper and lower package is a center-pad type chip including a plurality of bonding pads formed along a center portion of the active surface.

44. The multi-chip package of claim 43, wherein the board in each upper and lower package further includes:
a window on a center portion of the board, the window positioned on the board to expose the bonding pads on the active surface of the chip;
board pads formed on the lower surface of the board and arranged near the window;
bonding wires connecting the board pads with the bonding pads on the chip.

45. The multi-chip package of claim 44, each upper and lower package further includes an encapsulant sealing the window and protecting the bonding pads on the chip and the bonding wires.

46. The multi-chip package of claim 41, wherein the external ground and signal contact terminals protrude from the lower surface of the board of the upper package a height greater than the total combined height of the chip and heat spreader.

47. The multi-chip package of claim 41, wherein a greatest horizontal diameter of the external ground and signal contact terminals is sized to fit an inner diameter of the ground holes in the heat spreaders.

48. The multi-chip package of claim 45, wherein the heat spreader in each upper and lower package includes a cavity formed on a surface facing the lower surface of the board, the cavity sized for insertion of the encapsulant.

49. The multi-chip package of claim 41, further including a chip-side heat spreader on the upper package, the chip-side heat spreader attached to a back surface of the semiconductor chip in the upper package.

50. The multi-chip package of claim 49, wherein the chip-side heat spreader includes ground holes overlying the ground contact pads on the upper surface of the board in the upper package.

51. The multi-chip package of claim 50, further including ground bumps connecting the ground holes in the chip-side heat spreader to the ground contact pads on the upper surface of the board in the upper package.

52. The multi-chip package of claim 51, wherein a predetermined number of the ground bumps are dummy ground bumps.

53. The package of claim 29, wherein the semiconductor chip is a flip-chip type chip, where the chip includes bonding pads on the active surface flip-chip bonded to the upper surface of the board using bonding bumps.

54. The package of claim 53, further including a chip-side heat spreader, the chip-side heat spreader attached to a back surface of the semiconductor chip.

55. The package of claim 54, wherein the chip-side heat spreader includes ground holes overlying the ground contact pads on the upper surface of the board.

56. The package of claim 55, further including ground bumps connecting the ground holes in the chip-side heat spreader to the ground contact pads on the upper surface of the board.

57. The package of claim 56, wherein a predetermined number of the ground bumps are dummy ground bumps.

58. The multi-chip package of claim 41, wherein the semiconductor chip in each upper and lower package is a flip-chip type chip, where the chip includes bonding pads on the active surface flip-chip bonded to the upper surface of the board using bonding bumps.

59. The multi-chip package of claim 58, further including a chip-side heat spreader on the upper package, the chip-side heat spreader attached to a back surface of the semiconductor chip in the upper package.

60. The multi-chip package of claim 59, wherein the chip-side heat spreader includes ground holes overlying the ground contact pads on the upper surface of the board in the upper package.

61. The multi-chip package of claim 60, further including ground bumps connecting the ground holes in the chip-side heat spreader to the ground contact pads on the upper surface of the board in the upper package.

62. The multi-chip package of claim 61, wherein a predetermined number of the ground bumps are dummy ground bumps.

* * * * *